United States Patent
Farnworth et al.

(10) Patent No.: US 7,519,881 B2
(45) Date of Patent: *Apr. 14, 2009

(54) DEVICE AND METHOD FOR TESTING INTEGRATED CIRCUIT DICE IN AN INTEGRATED CIRCUIT MODULE

(75) Inventors: Warren M. Farnworth, Nampa, ID (US); James M. Wark, Boise, ID (US); Eric S. Nelson, Boise, ID (US); Kevin G. Duesman, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 261 days.

This patent is subject to a terminal disclaimer.

(21) Appl. No.: 11/389,874

(22) Filed: Mar. 27, 2006

(65) Prior Publication Data

US 2006/0244473 A1  Nov. 2, 2006

Related U.S. Application Data

(63) Continuation of application No. 10/801,254, filed on Mar. 16, 2004, now Pat. No. 7,034,560, which is a continuation of application No. 10/396,163, filed on Mar. 25, 2003, now Pat. No. 6,801,048, which is a continuation of application No. 09/797,368, filed on Mar. 1, 2001, now Pat. No. 6,605,956, which is a continuation of application No. 09/097,427, filed on Jun. 15, 1998, now Pat. No. 6,240,535, which is a continuation-in-part of application No. 08/718,173, filed on Sep. 19, 1996, now Pat. No. 5,796,746, which is a continuation-in-part of application No. 08/577,840, filed on Dec. 22, 1995, now Pat. No. 5,825,697, and a continuation-in-part of application No. 08/666,247, filed on Jun. 20, 1996, now Pat. No. 5,764,574.

(51) Int. Cl.
*G01R 31/28* (2006.01)

(52) U.S. Cl. .................. 714/724; 324/763; 365/200; 365/201; 326/38

(58) Field of Classification Search .................. 714/30, 714/718, 733–734, 738, 745, 724; 365/200–201; 324/763; 326/38, 158.1
See application file for complete search history.

(56) References Cited

U.S. PATENT DOCUMENTS 4,459,685 A  7/1984 Sud et al.

(Continued)

FOREIGN PATENT DOCUMENTS

EP  0 218 852  4/1987

(Continued)

OTHER PUBLICATIONS

NN8607696 (Test Circuit for Detecting and Measuring a Defect-Induced Increase in the Word Line Potential of Semiconductor Arrays; IBM Technical Disclosure Bulletin: vol. #29, pp. 696-698; Jul. 1, 1986.

*Primary Examiner*—Guy J Lamarre
(74) *Attorney, Agent, or Firm*—TraskBritt

(57) ABSTRACT

An IC module, such as a Multi-Chip Module (MCM), includes multiple IC dice, each having a test mode enable bond pad, such as an output enable pad. A fuse incorporated into the MCM's substrate connects each die's test mode enable bond pad to one of the MCM's no-connection (N/C) pins, and a resistor incorporated into the substrate connects the test mode enable bond pads to one of the MCM's ground pins. By applying a supply voltage to the test mode enable bond pads through the N/C pin, a test mode is initiated in the dice. Once testing is complete, the fuse may be blown, and a ground voltage applied to the test mode enable bond pads through the ground pins so the resistor disables the test mode in the dice and initiates an operational mode. As a result, dice packaged in IC modules may be tested after packaging.

20 Claims, 14 Drawing Sheets

U.S. PATENT DOCUMENTS

| | | | |
|---|---|---|---|
| 4,459,693 | A | 7/1984 | Prang et al. |
| 4,491,857 | A | 1/1985 | McElroy |
| 4,519,078 | A | 5/1985 | Komonytsky |
| 4,543,594 | A | 9/1985 | Mohsen et al. |
| 4,598,388 | A | 7/1986 | Anderson |
| 4,601,019 | A | 7/1986 | Shah et al. |
| 4,752,118 | A | 6/1988 | Johnson |
| 4,817,093 | A | 3/1989 | Jacobs et al. |
| 4,881,114 | A | 11/1989 | Mohsen et al. |
| 4,887,239 | A | 12/1989 | Turner |
| 4,937,465 | A | 6/1990 | Johnson et al. |
| 4,939,694 | A | 7/1990 | Eaton et al. |
| 5,089,993 | A | 2/1992 | Neal et al. |
| 5,110,754 | A | 5/1992 | Lowrey et al. |
| 5,126,971 | A | 6/1992 | Lin et al. |
| 5,157,664 | A | 10/1992 | Waite |
| 5,241,496 | A | 8/1993 | Lowrey et al. |
| 5,257,229 | A | 10/1993 | McClure et al. |
| 5,278,839 | A | 1/1994 | Matsumoto et al. |
| 5,301,143 | A | 4/1994 | Ohri et al. |
| 5,305,267 | A | 4/1994 | Haraguchi et al. |
| 5,324,681 | A | 6/1994 | Lowrey et al. |
| 5,331,196 | A | 7/1994 | Lowrey et al. |
| 5,355,340 | A | 10/1994 | Coker et al. |
| 5,402,018 | A | 3/1995 | Koyanagi |
| 5,406,520 | A | 4/1995 | Tay |
| 5,412,593 | A | 5/1995 | Magel et al. |
| 5,422,850 | A | 6/1995 | Sukegawa et al. |
| 5,430,679 | A | 7/1995 | Hiltebeitel et al. |
| 5,451,489 | A | 9/1995 | Leedy |
| 5,455,798 | A | 10/1995 | McClure |
| 5,491,664 | A | 2/1996 | Phelan |
| 5,506,499 | A | 4/1996 | Puar |
| 5,528,600 | A | 6/1996 | El Ayat et al. |
| 5,539,349 | A | 7/1996 | Roy |
| 5,550,394 | A | 8/1996 | Sukegawa et al. |
| 5,566,107 | A | 10/1996 | Gilliam |
| 5,576,999 | A | 11/1996 | Kim et al. |
| 5,663,902 | A | 9/1997 | Bennett et al. |
| 5,796,746 | A | 8/1998 | Farnworth et al. |
| 5,896,040 | A | 4/1999 | Brannigan et al. |
| 5,982,188 | A | 11/1999 | Lysinger |
| 6,009,536 | A | 12/1999 | Rohwer |
| 6,240,535 | B1 | 5/2001 | Farnworth et al. |
| 6,605,956 | B2 | 8/2003 | Farnworth et al. |

FOREIGN PATENT DOCUMENTS

| | | |
|---|---|---|
| EP | 0 584 739 A | 3/1994 |
| JP | 06-012878 | 1/1994 |
| JP | 06-069308 | 3/1994 |
| JP | 06-069342 | 3/1994 |
| JP | 06-176597 | 6/1994 |
| JP | 07-263563 | 10/1995 |

DEVICE AND METHOD FOR TESTING INTEGRATED CIRCUIT DICE IN AN INTEGRATED CIRCUIT MODULE

CROSS-REFERENCE TO RELATED APPLICATIONS

This application is a continuation of application Ser. No. 10/801,254, filed Mar. 16, 2004, now U.S. Pat. No. 7,034,560 issued Apr. 25, 2006, which is a continuation of application Ser. No. 10/396,163 filed Mar. 25, 2003, now U.S. Pat. No. 6,801,048, issued Oct. 5, 2004, which is a continuation of application Ser. No. 09/797,368, filed Mar. 1, 2001, now U.S. Pat. No. 6,605,956, issued Aug. 12, 2003, which is a continuation of application Ser. No. 09/097,427, filed Jun. 15, 1998, now U.S. Pat. No. 6,240,535, issued May 29, 2001, which is a continuation-in-part of Ser. No. 08/718,173, filed Sep. 19, 1996, now U.S. Pat. No. 5,796,746, issued Aug. 18, 1998, which is a continuation-in-part of application Ser. No. 08/577,840, filed Dec. 22, 1995, now U.S. Pat. No. 5,825,697, issued Oct. 20, 1998, and Ser. No. 08/666,247, filed Jun. 20, 1996, now U.S. Pat. No. 5,764,574, issued Jun. 9, 1998.

BACKGROUND OF THE INVENTION

1. Technical Field

This invention relates in general to integrated circuit (IC) dice and, in particular, to devices and methods for testing dice in IC modules.

2. State of the Art

Integrated circuit (IC) dice are typically tested before they are packaged to determine if they have any failing circuitry. In general, one of the first steps in testing a die is to initiate a test mode in the die by applying control signals to selected bond pads on the die referred to as test bond pads. As an example, most Dynamic Random Access Memory (DRAM) dice manufactured by the Assignee of this invention, Micron Technology, Inc. of Boise, Id., are tested in a test mode initiated, in part, by applying a logic "0" signal to their Output Enable (OE) bond pad.

As shown in FIG. 1, when multiple dice 10 are packaged together in an IC module 12, their test bond pads 14 (e.g., their OE bond pads) are often interconnected with their reference voltage bond pads 16 to the reference voltage $V_{SS}$ through module terminals 18 to ensure that a test mode cannot be accidentally initiated in an end user's system. While this works well to prevent accidental initiation of a test mode in dice in an IC module in the field, unfortunately it also prevents intentional testing of the dice by an IC manufacturer after they are packaged in the IC module.

One conventional solution to this problem, described in U.S. Pat. Nos. 5,278,839 and 4,519,078, is to eliminate the need to initiate a test mode in the manner described above by incorporating self test circuitry into dice. Because the self test circuitry is controlled through address and control bond pads that generally are not fixed to the reference voltage $V_{SS}$ or supply voltage $V_{CC}$, a test mode can be initiated with the self test circuitry after the dice are packaged in an IC module. However, self test circuitry is a cumbersome and expensive solution that does not address the need for a solution that is easily incorporated into existing dice and IC modules.

Because it would be advantageous to have the flexibility to test dice after they are packaged in an IC module, there is a need in the art for an improved device and method for initiating and performing such testing.

BRIEF SUMMARY OF THE INVENTION

An inventive integrated circuit (IC) module, such as a Multi-Chip Module (MCM), includes a terminal receiving a test mode initiate signal, such as a supply voltage $V_{CC}$, and an IC die having a bond pad and a function circuit. A switching apparatus, such as a fuse, is connected with the bond pad between the terminal and the function circuit to conduct the test mode initiate signal to the function circuit, and an impedance apparatus, such as a resistor, connected between the function circuit and an operational mode signal, such as a reference voltage $V_{SS}$, supports a difference in voltages between the test mode initiate signal at the function circuit and the operation mode signal. The function circuit responds to the test mode initiate signal by initiating a test mode in the die. The switching circuit also selectively isolates the function circuit from the die, and the impedance apparatus then conducts the operational mode signal to the function circuit. The function circuit responds to the operational mode signal by entering an operational mode. Thus, a test mode can be initiated in the die after it is packaged in the IC module by providing the test mode initiate signal at the terminal, and the test mode can then be disabled and the die fixed in the operational mode by selectively isolating the function circuit from the terminal with the switching apparatus, thereby ensuring that the test mode is not accidentally initiated by an end user in the field.

In one version of this inventive IC module, the switching apparatus and the impedance apparatus are both incorporated in the die, and in other versions one or both of the switching apparatus and impedance apparatus are incorporated in a substrate of the IC module. In another version, the IC module itself is incorporated into an electronic system, such as a computer system. In still other versions, the operational mode signal is provided by an operational mode signal circuit on the die, or is provided by external circuitry through another terminal in the IC module. Finally, in a modified version of this inventive IC module, the test mode initiate signal is generated on the die by a test mode initiate signal circuit responsive to external circuitry rather than being provided by external circuitry.

In another embodiment of this invention, an IC module includes one or more terminals receiving a test mode initiate signal and an operational mode signal. One or more IC dice in the IC module each have one or more function circuits and a plurality of bond pads, and a first subset of the bond pads is coupled to the function circuits while a second subset of the bond pads is adapted to receive signals other than the test mode initiate signal in the test mode. A dedicated conduction circuit coupled between the terminals and the first subset bond pads and isolated from the second subset bond pads conducts the test mode initiate and operational mode signals to the function circuits. When the function circuits receive the test mode initiate signal, they initiate a test mode, and when the function circuits receive the operational mode signal, they enter an operational mode. Thus, a test mode can be initiated in the dice after they are packaged in the IC module by providing the test mode initiate signal at the terminals, and an operational mode can be initiated by providing the operational mode signal at the terminals. In one version of this IC module, the IC module is incorporated into an electronic system. In other versions, the terminals comprise a first terminal receiving the test mode initiate signal and a second terminal receiving the operational mode signal, and the first and second terminals are coupled by an impedance element, such as a resistor, or by a link, such as a surface mount resistor or a jumper.

In a further embodiment of this invention, a method for initiating a test mode and an operational mode in dice in an IC module includes: receiving a test mode initiate signal at a terminal of the IC module; conducting the test mode initiate signal only to those bond pads on dice in the IC module adapted to receive the signal and from those bond pads to function circuits in the dice to initiate a test mode therein; discontinuing conduction of the test mode initiate signal to the function circuits; and conducting an operational mode initiate signal to each function circuit to initiate the operational mode therein.

In a still further embodiment, a method for testing one or more dice in an IC module includes: providing a test mode initiate signal to an externally accessible terminal of the IC module; conducting the test mode initiate signal exclusively to bond pads on the dice adapted to receive the signal to initiate a test mode in the dice; testing each die; receiving response signals from the dice; and evaluating the response signals to identify any failing elements in the dice.

DETAILED DESCRIPTION OF THE INVENTION

Figure 1:
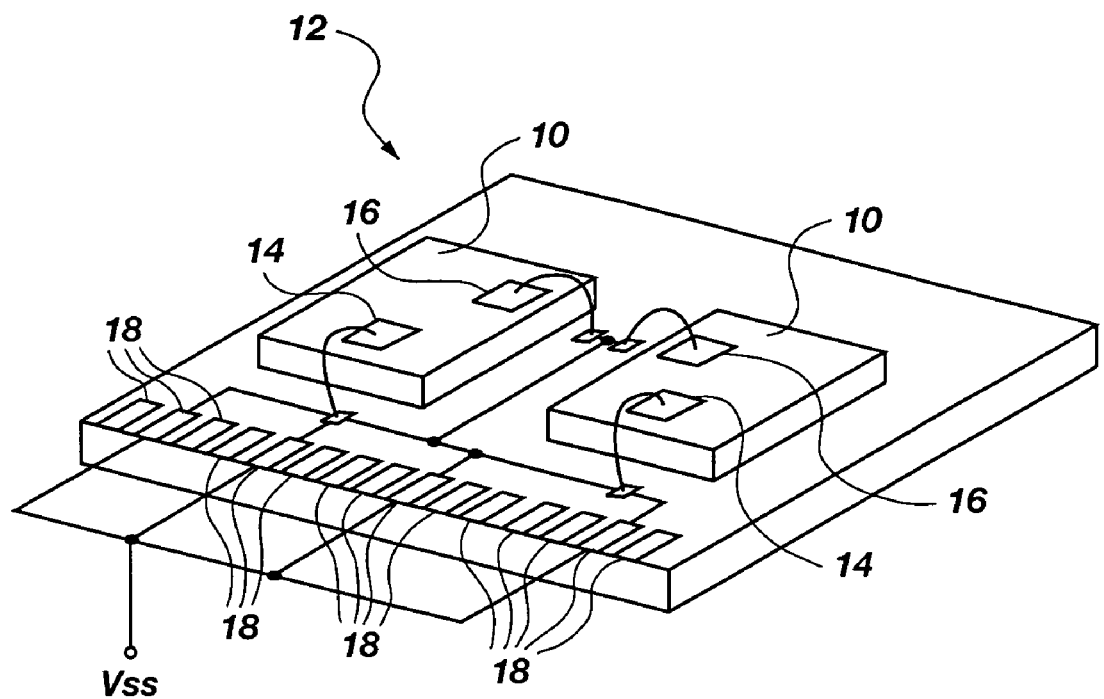
FIG. 1 is an isometric view of a conventional integrated circuit module.
Figure 2:
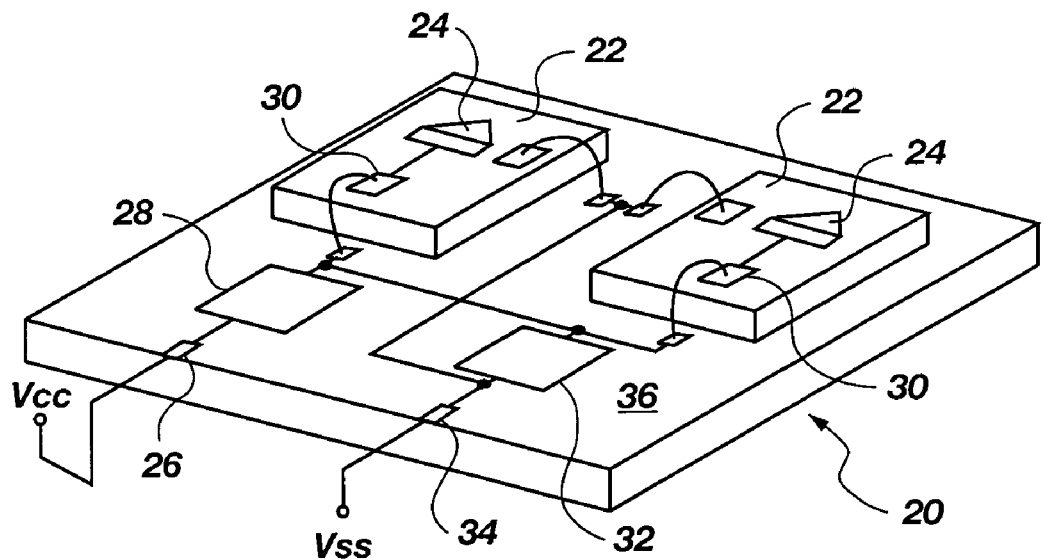
FIG. 2 is an isometric, block and schematic view of an integrated circuit module including a switching circuit and an impedance circuit in accordance with this invention.

As shown in FIG. 2, an inventive integrated circuit (IC) module 20 includes IC dice 22 having function circuits, such as input buffers 24, selectively receiving a test mode initiate signal, such as a supply voltage $V_{cc}$, through a module terminal 26, a switching circuit 28, and test mode enable bond pads 30 (e.g., Output Enable (OE) bond pads). It will be understood by those having skill in the field of this invention that the IC module 20 may be any electronic structure having at least one die accessed externally through terminals, including, for example, any Multi-Chip Module (MCM), such as a Single In-line Memory Module (SIMM), a Dual In-line Memory Module (DIMM), a Random Access Memory (RAM) card, a flash Read-Only-Memory (ROM) module or card, a Synchronous Dynamic RAM (SDRAM) module or card, and a Rambus RAM module or card. It will also be understood that the dice 22 may be any dice for purposes of this invention, including, for example, DRAM dice, Static Random Access Memory (SRAM) dice, Synchronous Graphics Random Access Memory (SGRAM) dice, ROM dice, and processor dice.

Also, it will be understood that the function circuits may be any circuitry on a die for initiating a test mode in the die, the test mode initiate signal may be any signal for initiating a test mode in a die, the module terminal 26 may be any terminal including, for example, an MCM pin (e.g., a SIMM, DIMM, RAM card, RAM module, ROM card, or ROM module pin), the switching circuit 28 may be, for example, a fuse or a transistor or any other device for selectively isolating the function circuits from the module terminal 26, and the test mode enable bond pads 30 may be any bond pads connectable to a function circuit for enabling a test mode in a die. Further, it should be understood that although the switching circuit 28 is shown in FIG. 2 as being a single circuit coupled to the module terminal 26, it may instead comprise a plurality of circuits, each one coupled to the module terminal 26 and one of the dice 22.

In response to receiving the test mode initiate signal, the input buffers 24 initiate a test mode in the dice 22. In this mode, various test signals may be provided to the dice 22 in a well known manner to test the circuitry thereon, and the dice 22 then output various response signals indicating the presence of any failing circuitry. While the test mode initiate signal, such as the supply voltage $V_{CC}$, is being provided to the test mode enable bond pads 30 and the input buffers 24, an impedance circuit 32, such as, for example, a resistor, resistance-connected MOS transistor, or anti-fuse, supports a difference in voltages between the test mode initiate signal at the test mode enable bond pads 30 and an operational mode enable signal, such as a reference voltage $V_{SS}$, at a reference terminal 34, such as, for example, an MCM pin (e.g., a SIMM, DIMM, RAM card, RAM module, ROM card, or ROM module pin). It will be understood that although the impedance circuit 32 is shown in FIG. 2 as being a single circuit coupled to the reference terminal 34, it may instead comprise a plurality of circuits, each one coupled to the reference terminal 34 and one of the dice 22.

Once testing of the dice 22 is complete, the switching circuit 28 isolates the input buffers 24 from the module terminal 26 to disable the test mode, and the impedance circuit 32 conducts the operational mode signal, such as the reference voltage $V_{SS}$, to the input buffers 24. In response, the input buffers 24 initiate an operational mode in the dice 22 in which the dice 22 operate in accordance with their intended normal function. Thus, for example, if the dice 22 are DRAMs, they would perform normal memory operations in their operational mode.

Thus, the dice 22 in the IC module 20 are fully testable even after being packaged, and yet their test mode can be disabled as necessary so the IC module 20 can be used by end users in the field.

As will be described in more detail below with respect to FIGS. 6 and 9, one or both of the switching circuit 28 and the impedance circuit 32 may be incorporated into the dice 22 instead of being provided on a substrate 36 of the IC module 20 as shown in FIG. 2. Also, as will be described in more detail below with respect to FIG. 9, one or both of the test mode initiate signal and the operational mode signal may be generated on the dice 22 rather than being provided by external circuitry.

Figure 3A:
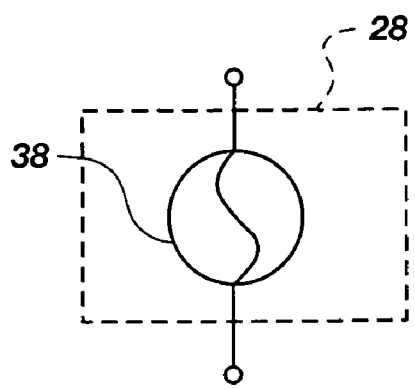
FIGS. 3A-C are schematic views of alternative versions of the switching circuit of FIG. 2.
Figure 3B:
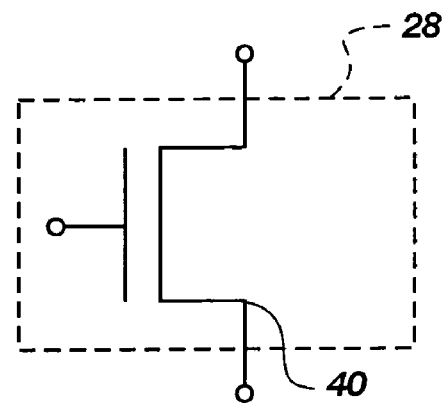
Figure 3C:
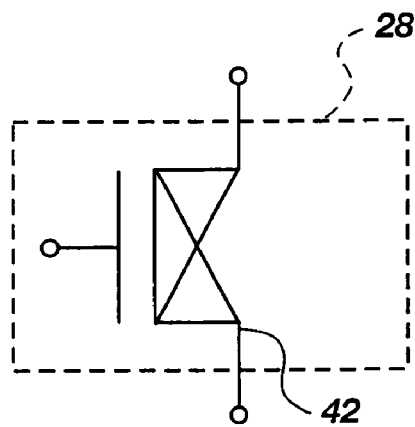
Figure 4A:
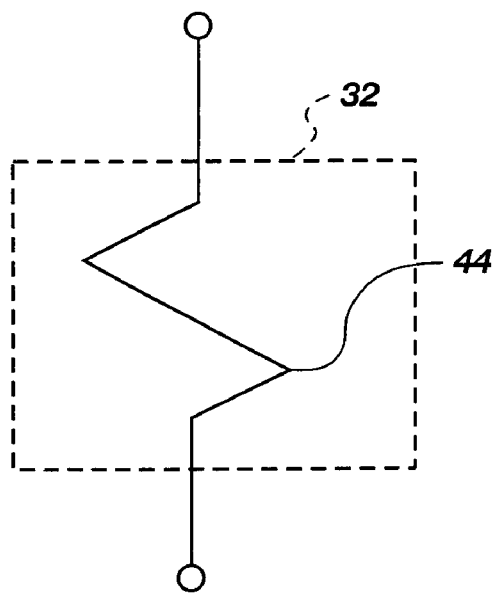
FIGS. 4A-C are schematic views of alternative versions of the impedance circuit of FIG. 2.
Figure 4B:
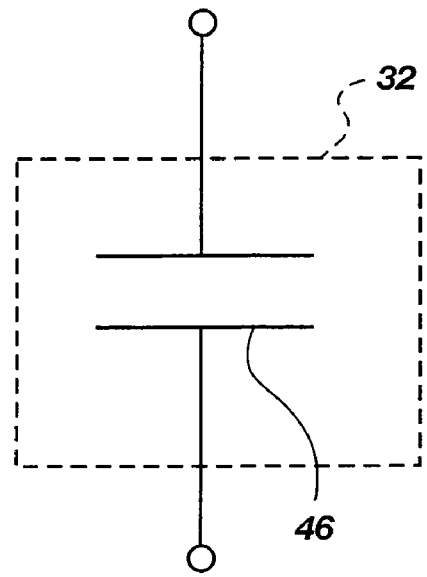
Figure 4C:
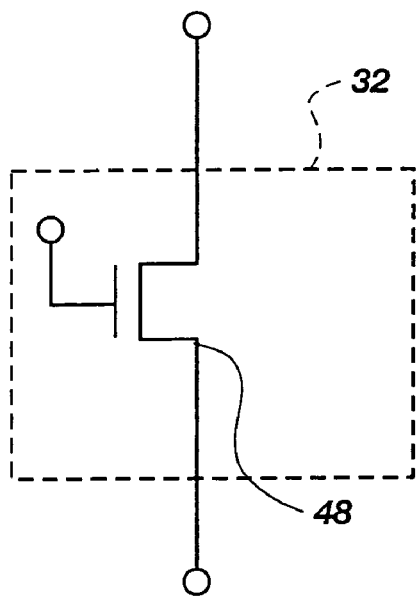
Figure 5:
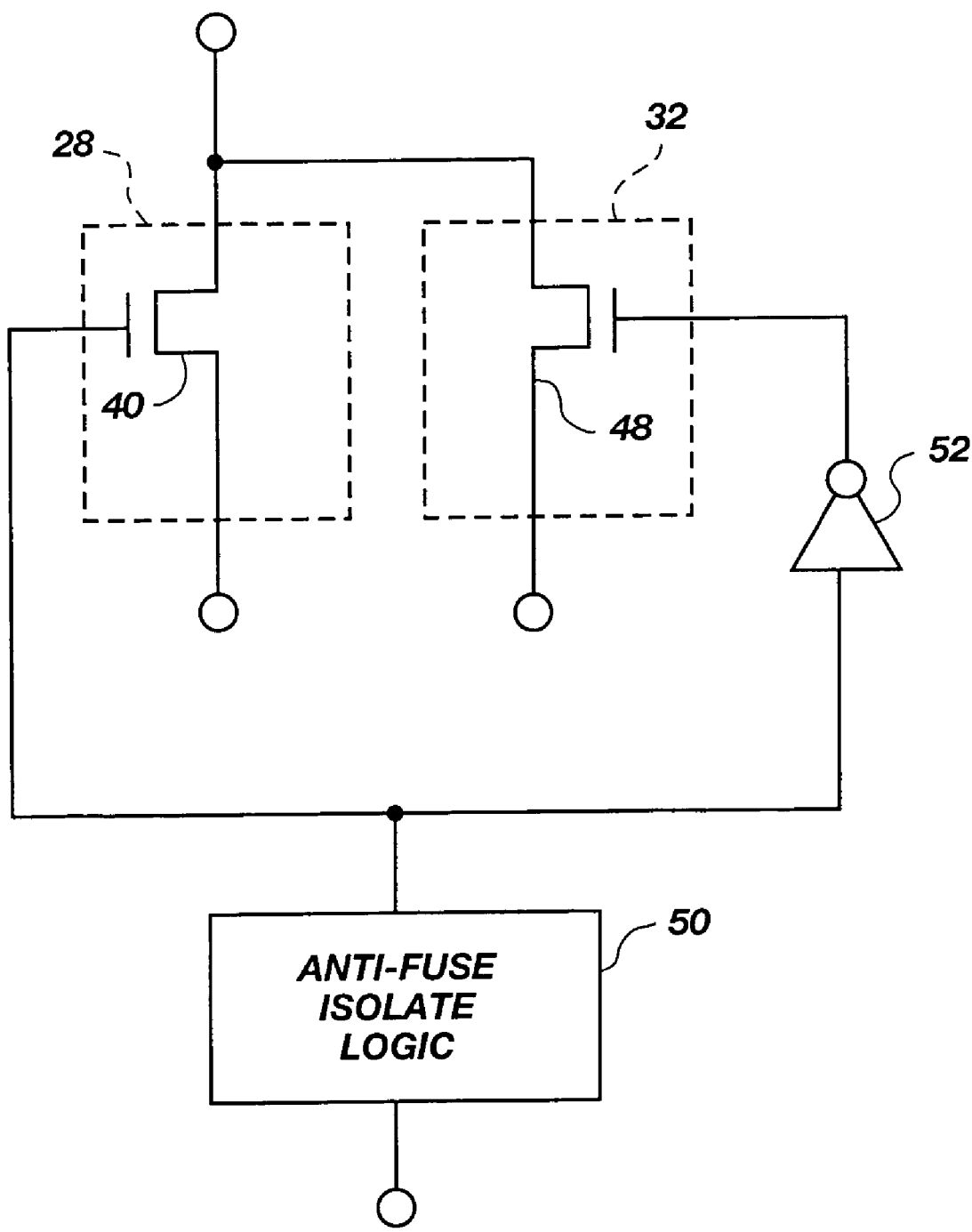
FIG. 5 is a schematic and block view of an alternative version of the switching and impedance circuits of FIG. 2.

As shown in FIGS. 3A, 3B, and 3C, the switching circuit 28 of FIG. 2 can be, for example, a fuse 38 that is blown once testing is complete, or an NMOS transistor 40 or PMOS transistor 42 that is de-activated once testing is complete. Also, as shown in FIGS. 4A, 4B and 4C, the impedance circuit 32 of FIG. 2 can be, for example, a resistor 44, an anti-fuse 46 that is blown once testing is complete, or an NMOS transistor 48 that is activated once testing is complete. Further, as shown in FIG. 5, the NMOS transistor 40 of FIG. 3B and the NMOS transistor 48 of FIG. 4C, for example, may be controlled by an anti-fuse isolate logic circuit 50 that outputs a high voltage during a test mode and is then programmed to output a low voltage once testing is complete. The high voltage during the test mode activates the NMOS transistor 40 and de-activates the NMOS transistor 48 through an inverter 52, and the low voltage after programming de-activates the NMOS transistor 40 and activates the NMOS transistor 48 through the inverter 52. Of course, a wide variety of other combinations are well within the scope of this invention.

Figure 6A:
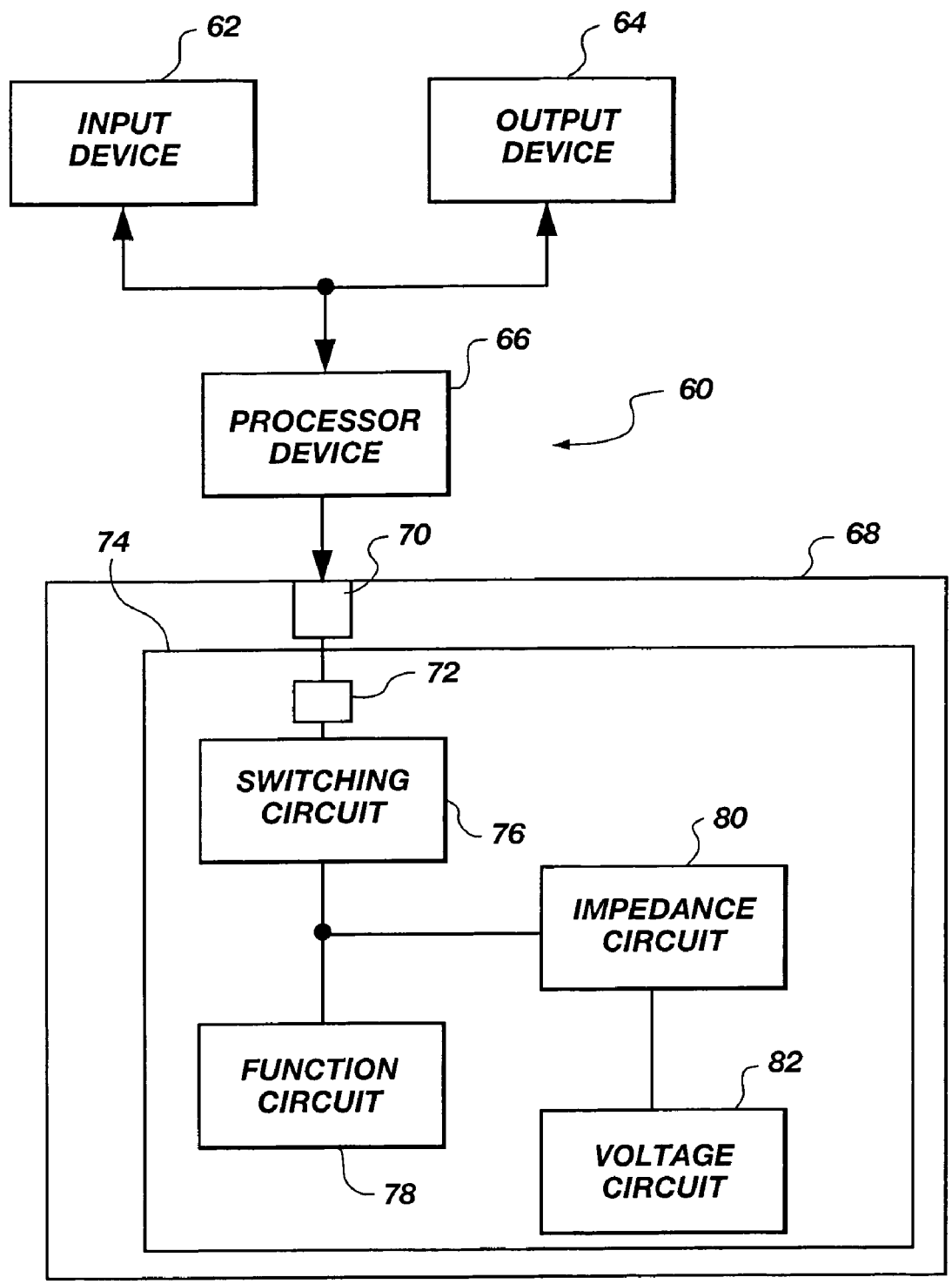
FIG. 6A is a block diagram of an electronic system in accordance with this invention.

As shown in FIG. 6A, in another embodiment, this invention comprises an electronic system 60, such as a computer system, including an input device 62, an output device 64, a processor device 66, such as a state machine, and a memory device, such as an IC module 68. Although this embodiment will be described with respect to the memory device comprising the IC module 68, it will be understood that the IC module 68 could comprise all or any portion of the input device 62, the output device 64, the processor device 66, and the memory device. Also, although the electronic system 60 will be described with respect to a particular IC module 68, it will be understood that this invention includes any of the inventive IC modules described herein as incorporated into an electronic system. Further, as discussed above, it will be understood that the IC module 68 may comprise any electronic structure having at least one die externally accessible through terminals, including, for example, an MCM, such as a SIMM, DIMM, RAM card, RAM module, ROM card, or ROM module.

The IC module 68 includes a terminal 70, such as an MCM pin as discussed above, receiving a test mode initiate signal (e.g., the supply voltage $V_{CC}$) from the processor device 66. The terminal 70 conducts the test mode initiate signal to a bond pad 72 of an IC die 74. As discussed above, it will be understood that the IC die 74 may be any die, including, for example, a DRAM die, SRAM die, SGRAM die, processor die, flash ROM die, SDRAM die, or Rambus RAM die.

To initiate a test mode in the die 74, a switching circuit 76 conducts the test mode initiate signal from the bond pad 72 to a function circuit 78 (e.g., an OE input buffer). In response, the function circuit 78 initiates a test mode in the die 74 as described above. While the test mode initiate signal is being conducted to the function circuit 78, an impedance circuit 80 supports a difference in voltages between the test mode initiate signal at the function circuit 78 and an operational mode signal, such as a reference voltage $V_{SS}$, supplied by an operational mode voltage circuit 82.

It should be understood that the switching circuit 76 may, for example, comprise a fuse, a MOS transistor, or a flash memory cell, the function circuit 78 may comprise any circuit which enables or initiates a test mode in response to a test mode initiate signal, the impedance circuit 80 may, for example, comprise an anti-fuse, a MOS transistor, or a resistor, and the operational mode voltage circuit 82 may comprise any circuit for supplying an operational mode signal, such as a reference voltage $V_{SS}$, on a die.

When testing is over, the switching circuit 76 isolates the function circuit 78 from the bond pad 72 to disable the test mode in the die 74 by, for example, blowing a fuse or de-activating a MOS transistor. The impedance circuit 80 then conducts the operational mode signal from the operational mode voltage circuit 82 to the function circuit 78 by, for example, blowing an anti-fuse or activating a MOS transistor. In response to the operational mode signal, the function circuit 78 initiates an operational mode in the die 74 as described above.

Thus, the die 74 is fully testable even after being packaged in the IC module 68, and yet the test mode of the die 74 can be disabled as necessary so the IC module 68 can be used by end users in the field.

Figure 6B:
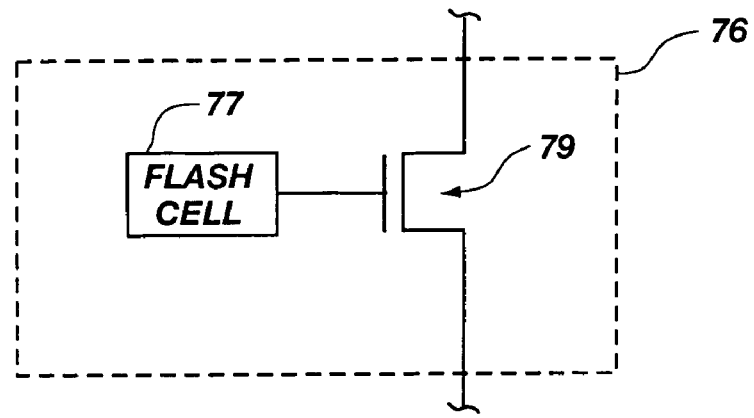
FIG. 6B is a block diagram and circuit schematic of a switching circuit of the electronic system of FIG. 6A.

As shown in detail in FIG. 6B, the switching circuit 76 of FIG. 6A may include a flash memory cell 77 programmed to activate or deactivate an NMOS transistor 79. The cell 77 may be programmed, for example, to conduct the test mode initiate signal during a test mode, and to isolate the bond pad 72 (FIG. 6A) from the function circuit 78 (FIG. 6A) during normal operations of the electronic system 60 (FIG. 6A).

Figure 7:
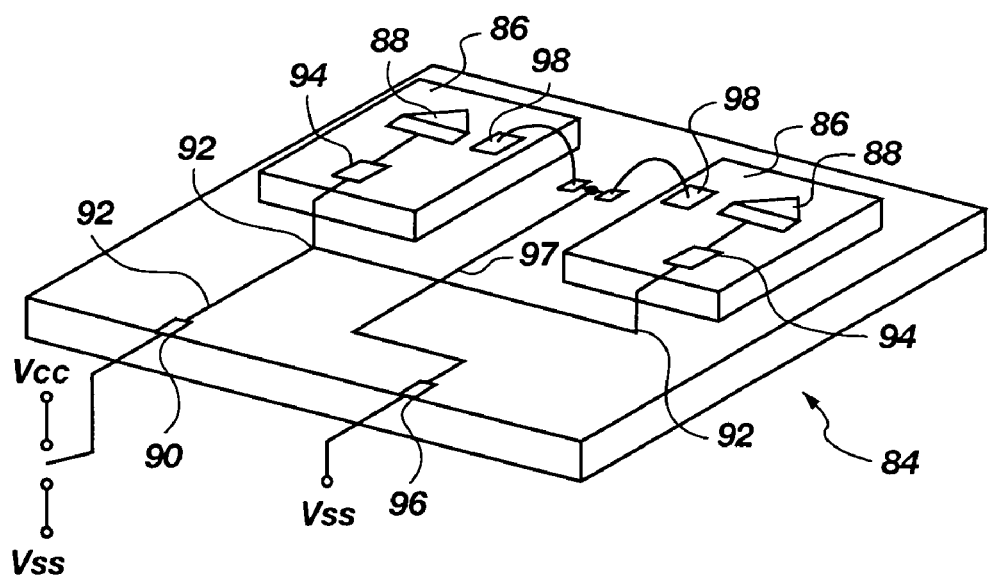
FIG. 7 is an isometric and schematic view of another integrated circuit module in accordance with this invention.

As shown in FIG. 7, an inventive IC module 84 includes dice 86 having function circuits, such as input buffers 88, selectively receiving a test mode initiate signal, such as a supply voltage $V_{cc}$, through a first terminal 90, a dedicated conductor 92, and test mode enable bond pads 94 (e.g., Output Enable (OE) bond pads). It will be understood by those having skill in the field of this invention that the IC module 84 may be any electronic structure having at least one die accessed externally through terminals, including, for example, an MCM, such as a SIMM, a DIMM, a RAM card, a RAM module, a ROM card, and a ROM module. It will also be understood that the dice 86 may be any dice for purposes of this invention, including, for example, DRAM dice, SRAM dice, SGRAM dice, flash ROM dice, SDRAM dice, Rambus RAM dice, and processor dice.

Also, it will be understood that the function circuits may be any circuitry on a die for initiating a test mode in the die, the test mode initiate signal may be any signal for initiating a test mode in a die, the first terminal 90 may be any terminal including, for example, an MCM pin, such as a SIMM, DIMM, RAM card, ROM card, RAM module, or ROM module pin, the dedicated conductor 92 may be, for example, any conductive structure or device connected exclusively to those bond pads 94 on the dice 86 adapted to receive the test mode initiate signal or unaffected by receipt of the test mode initiate signal, and the test mode enable bond pads 94 may be any bond pads connectable to a function circuit for enabling a test mode in In response to receiving the test mode initiate signal, the input buffers 88 initiate a test mode in the dice 86 in a well known manner as described above. Once testing of the dice 86 is complete, an operational mode signal, such as a reference voltage $V_{SS}$, is provided through the first terminal 90 and the dedicated conductor 92 to the input buffers 88 to initiate an operational mode in the dice 86 in the well known manner described above. A second terminal 96 provides the reference voltage $V_{SS}$ to other circuits in the dice 86 via a reference conductor 97 and reference voltage bond pads 98.

Thus, the dice 86 in the IC module 84 are fully testable even after being packages, and yet the operational mode can be enabled as necessary so the IC module 84 can be used by end users in the field.

Figure 8A:
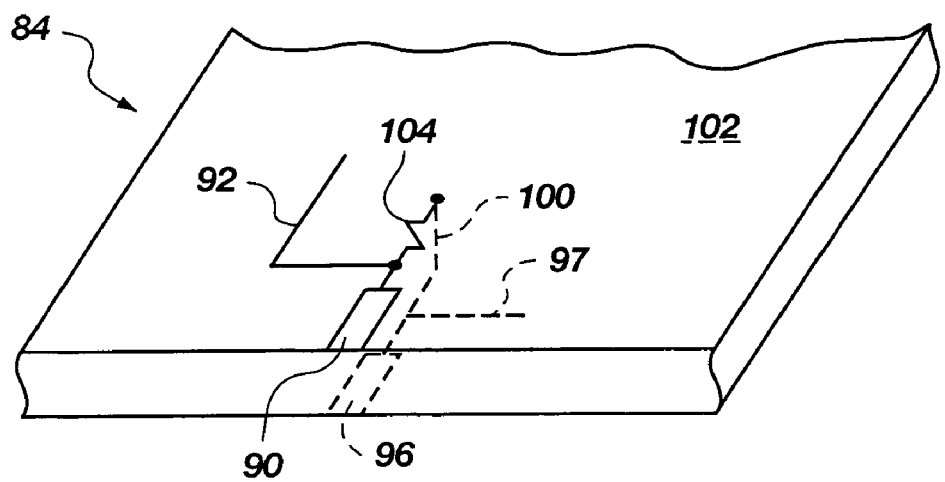
FIGS. 8A and 8B are isometric and schematic views of alternative versions of the integrated circuit module of FIG. 7.

As shown in FIG. 8A in an isometric view of a portion of an alternative version of the IC module 84 of FIG. 7, a conductive via 100 through a substrate 102 of the IC module 84 couples the first terminal 90 and dedicated conductor 92 to the second terminal 96 and the reference conductor 97 through an impedance element, such as a surface mount resistor 104. Of course, the impedance element may, for example, comprise a resistance-connected MOS transistor rather than the surface mount resistor 104.

During testing, a test mode initiate signal, such as the supply voltage $V_{CC}$, may be supplied to the first terminal 90 to initiate a test mode as described above with respect to FIG. 7. At the same time, an operational mode signal, such as the reference voltage $V_{SS}$, may be supplied to the second terminal 96 without interfering with the test mode, because the surface mount resistor 104 supports a difference in voltages between the test mode initiate signal at the first terminal 90 and the operational mode signal at the second terminal 96.

Once testing is complete, the operational mode signal, or no signal, may be supplied to the first terminal 90. At the same time, the surface mount resistor 104 conducts the operational mode signal from the second terminal 96 to the dedicated conductor 92, in order to initiate the operational mode as described above with respect to FIG. 7.

Figure 8B:
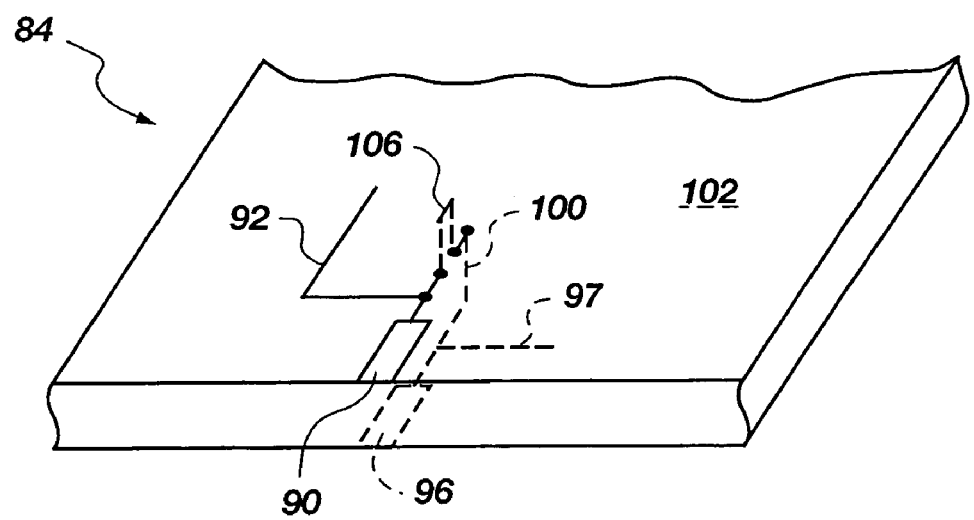

As shown in FIG. 8B in an isometric view of a portion of another alternative version of the IC module 84 of FIG. 7, a test mode initiate signal, such as the supply voltage $V_{cc}$, may be supplied to the first terminal 90 during testing to initiate a test mode as described above with respect to FIG. 7. At the same time, an operational mode signal, such as the reference voltage $V_{ss}$, may be supplied to the second terminal 96 and the reference conductor 97 without interfering with the test mode, because a removable link 106, such as a jumper or zero Ohm surface mount resistor, is not present during testing, thus isolating the second terminal 96 from the first terminal 90.

Once testing is complete, the operational mode signal, or no signal, may be supplied to the first terminal 90. At the same time, the link 106 is positioned to connect the second terminal to the dedicated conductor 92 through the conductive via 100 in the substrate 102, thereby conducting the operational mode signal from the second terminal 96 to the dedicated conductor 92 in order to initiate the operational mode as described above with respect to FIG. 7.

Although the first and second terminals 90 and 96 are shown in FIGS. 8A and 8B as being on opposing sides of the substrate 102, it will be understood that the invention is not so limited.

Figure 9:
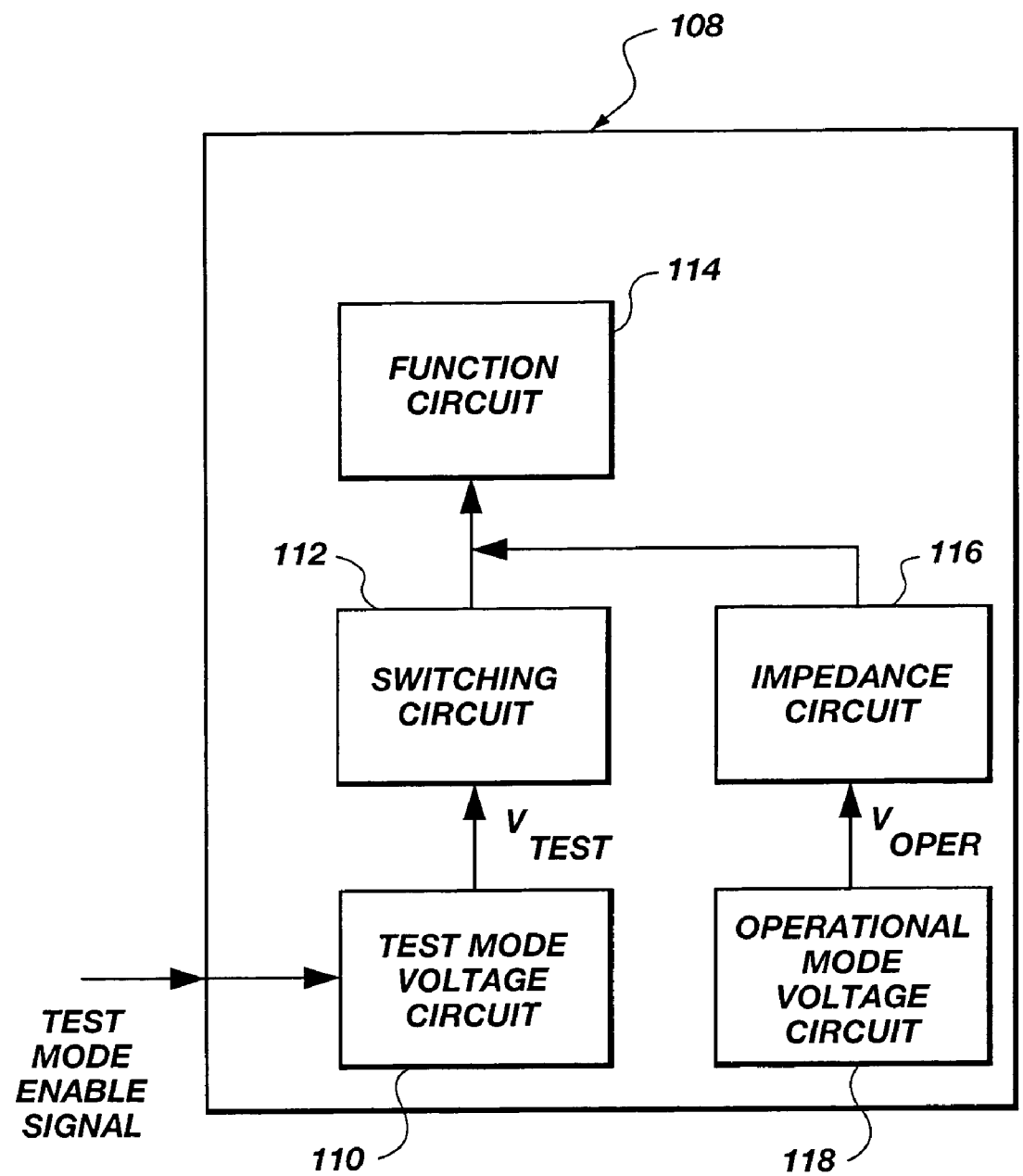
FIG. 9 is a block diagram of an integrated circuit die in accordance with this invention.

As shown in FIG. 9, in another embodiment, this invention comprises an IC die 108. As discussed above, the IC die 108 may be any die including, for example, a DRAM die, SRAM die, SGRAM die, flash ROM die, SDRAM die, Rambus RAM die, or processor die. To initiate a test mode in the die 108, a test mode enable signal directs a test mode voltage circuit 110 in the die 108 to generate a test mode voltage $V_{TEST}$, such as 3.3 Volts. A switching circuit 112 then conducts the test mode voltage $V_{TEST}$ to a function circuit 114 (e.g., an OE input buffer). In response, the function circuit 114 initiates a test mode in the die 108 as described above. While the test mode voltage $V_{TEST}$ is being conducted to the function circuit 114, an impedance circuit 116 supports a difference in voltages between the test mode voltage $V_{TEST}$ at the function circuit 114 and an operational mode voltage $V_{OPER}$, such as 0.0 Volts, supplied by an operational mode voltage circuit 118.

It should be understood that the switching circuit 112 may, for example, comprise a fuse or a MOS transistor, the function circuit 114 may comprise any circuit which enables or initiates a test mode in response to a test mode voltage $V_{TEST}$, the impedance circuit 116 may, for example, comprise an antifuse, a MOS transistor, or a resistor, and the operational mode voltage circuit 118 may comprise any circuit for supplying an operational mode voltage $V_{OPER}$ on a die.

When testing is over, the switching circuit 112 isolates the function circuit 114 from the test mode voltage $V_{TEST}$ to disable the test mode in the die 108 by, for example, blowing a fuse or de-activating a MOS transistor. The impedance circuit 116 then conducts the operational mode voltage $V_{OPER}$ from the operational mode voltage circuit 118 to the function circuit 114 by, for example, blowing an anti-fuse or activating a MOS transistor. In response to the operational mode voltage $V_{OPER}$, the function circuit 118 initiates an operational mode in the die 108 as described above.

Thus, the die 108 is fully testable even after being packaged, and yet the test mode of the die 108 can be disabled as necessary so the die 108 can be used by end users in the field.

Figure 10:
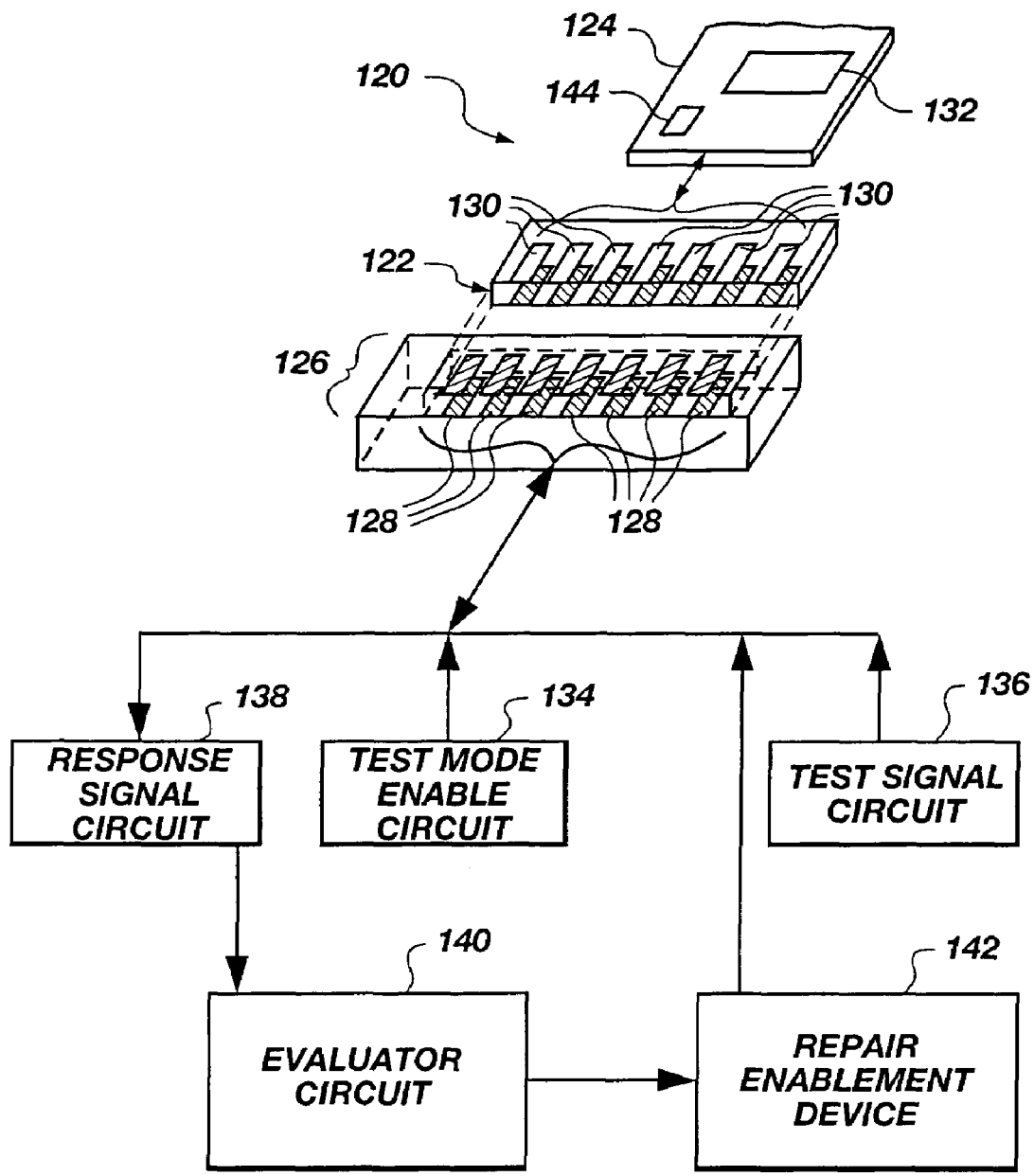
FIG. 10 is a block, schematic and isometric view of a test apparatus in accordance with this invention.

As shown in FIG. 10, a test apparatus 120 for testing an IC module 122 of this invention having an IC die 124 includes a test apparatus-to-module interface 126 having interface terminals 128 connectable to module terminals 130 on the IC module 122. The module terminals 130, in turn, are in communication with the die 124 including a redundancy circuit 132. A test mode enable circuit 134 provides a test mode initiate signal to the die 124 through the interface 126 to initiate a test mode in the die 124 in the manner described above. A test signal circuit 136 then provides test signals to the die 124 through the interface 126 to test the die 124 in the test mode. A response signal circuit 138 receives response signals from the die 124 in the test mode in response to the test signals, and an evaluator circuit 140 then evaluates the response signals to identify any failing circuitry in the die 124.

A repair enablement device 142 in the test apparatus 120 may provide repair control signals to the redundancy circuit 132 in the die 124 directing the redundancy circuit 132 to replace any failing circuitry identified by the evaluator circuit 140 with redundant elements 144 in the die 124. The manner in which repair control signals may direct the redundancy circuit 132 to repair any failing circuitry in the die 124 is well known by those skilled in the art.

Figure 11:
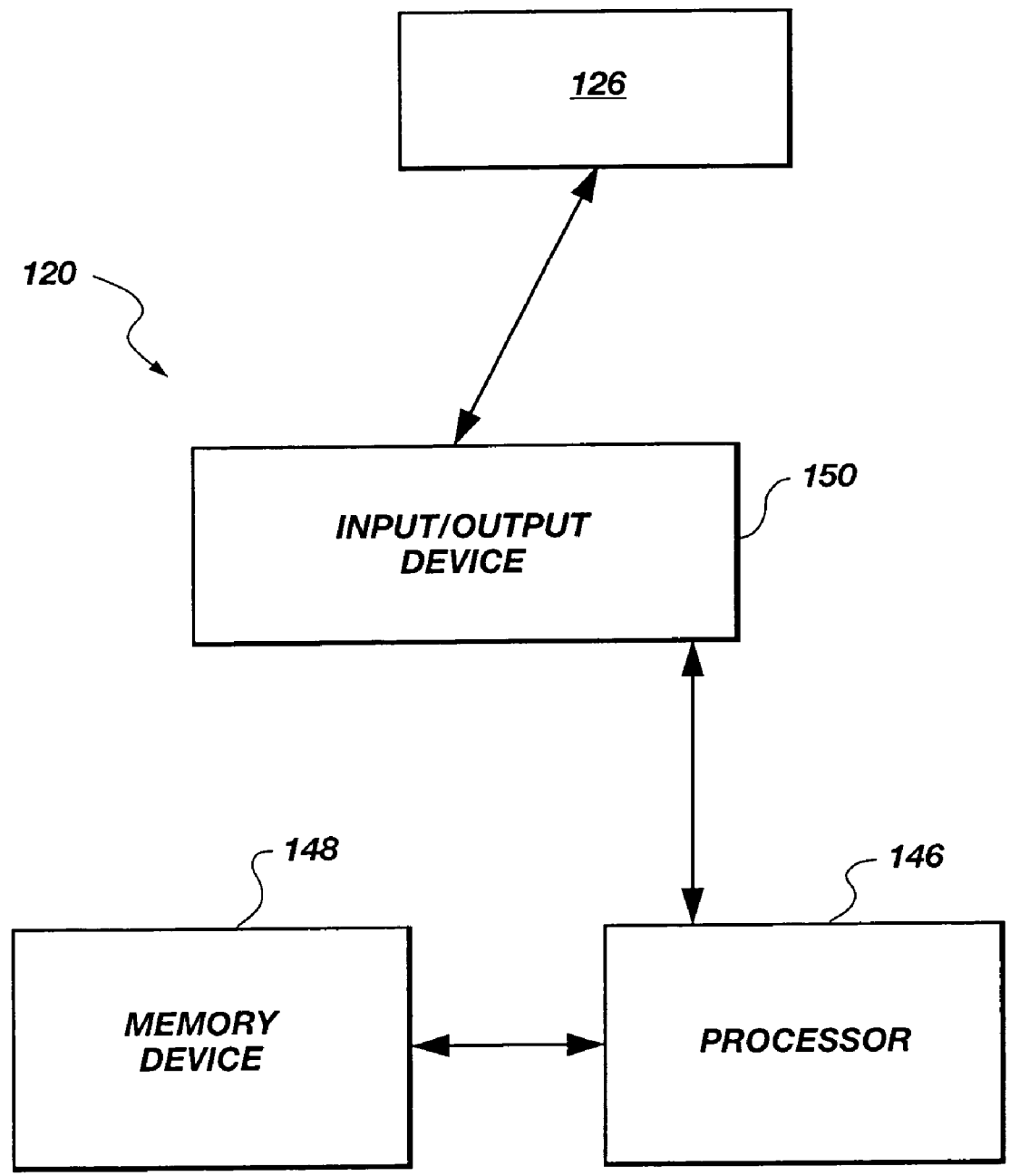
FIG. 11 is a block diagram of an alternative version of the test apparatus of FIG. 10.

As shown in FIG. 11 in a block diagram of an alternative version of the test apparatus 120 described with respect to FIG. 10, a processor 146 coupled to a memory device 148 and an input/output device 150 may provide the test mode initiate signal, the test signals, and the repair control signals, and may receive and evaluate the response signals, in the manner described above with respect to FIG. 10. It should be understood that the memory device 148 may comprise any permanent or temporary electronic storage medium, including, for example, a DRAM, SRAM, SGRAM, disk, tape, memory card, memory module, or programmable logic array.

Figure 12A:
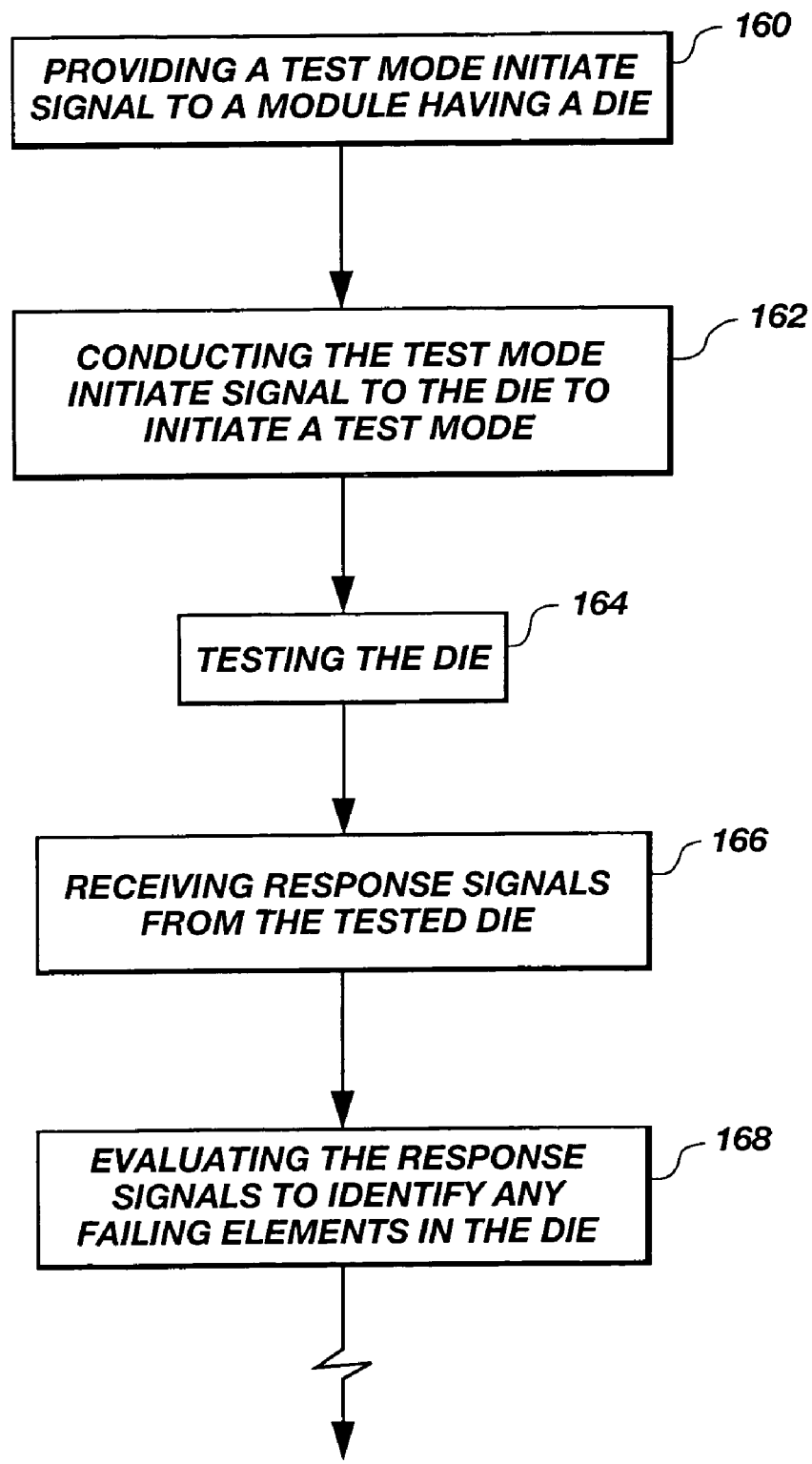
FIGS. 12A and 12B are flow diagrams of a method for testing integrated circuit dice in an integrated circuit module in accordance with this invention.
Figure 12B:
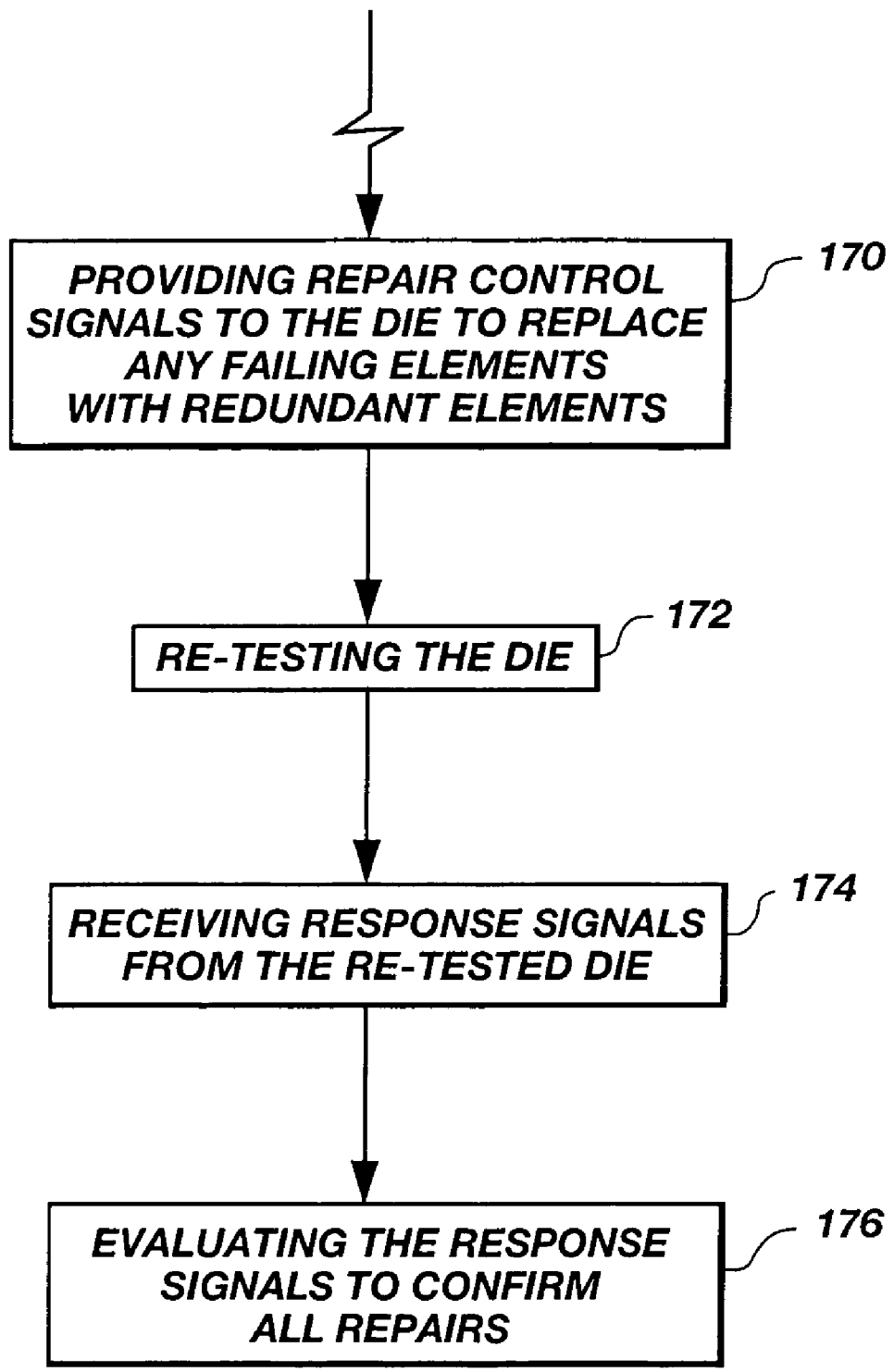

As shown in still another embodiment of this invention in FIGS. 12A and 12B, a method for testing any one of the above-described inventive IC dice or modules includes the steps of: 160 providing a test mode initiate signal to an externally accessible terminal of an IC module; 162 conducting the test mode initiate signal exclusively to bond pads on dice in the IC module adapted to receive the signal to initiate a test mode in the dice; 164 testing each of the dice in the test mode by providing test signals to each die through the externally accessible terminals of the IC module; 166 receiving response signals from each die through the terminals of the IC module in response to the test signals; 168 evaluating the response signals from each die to identify any failing elements in the dice of the IC module; 170 providing repair control signals to a redundant circuit in each die to direct each die to replace any identified failing elements with redundant elements; 172 re-testing each die by providing re-test signals to each die through the IC module's externally accessible terminals; 174 receiving response signals from each die through the IC module's terminals in response to the re-test signals; and 176 evaluating the response signals from each die to confirm the repair of any failing elements therein.

Figure 13A:
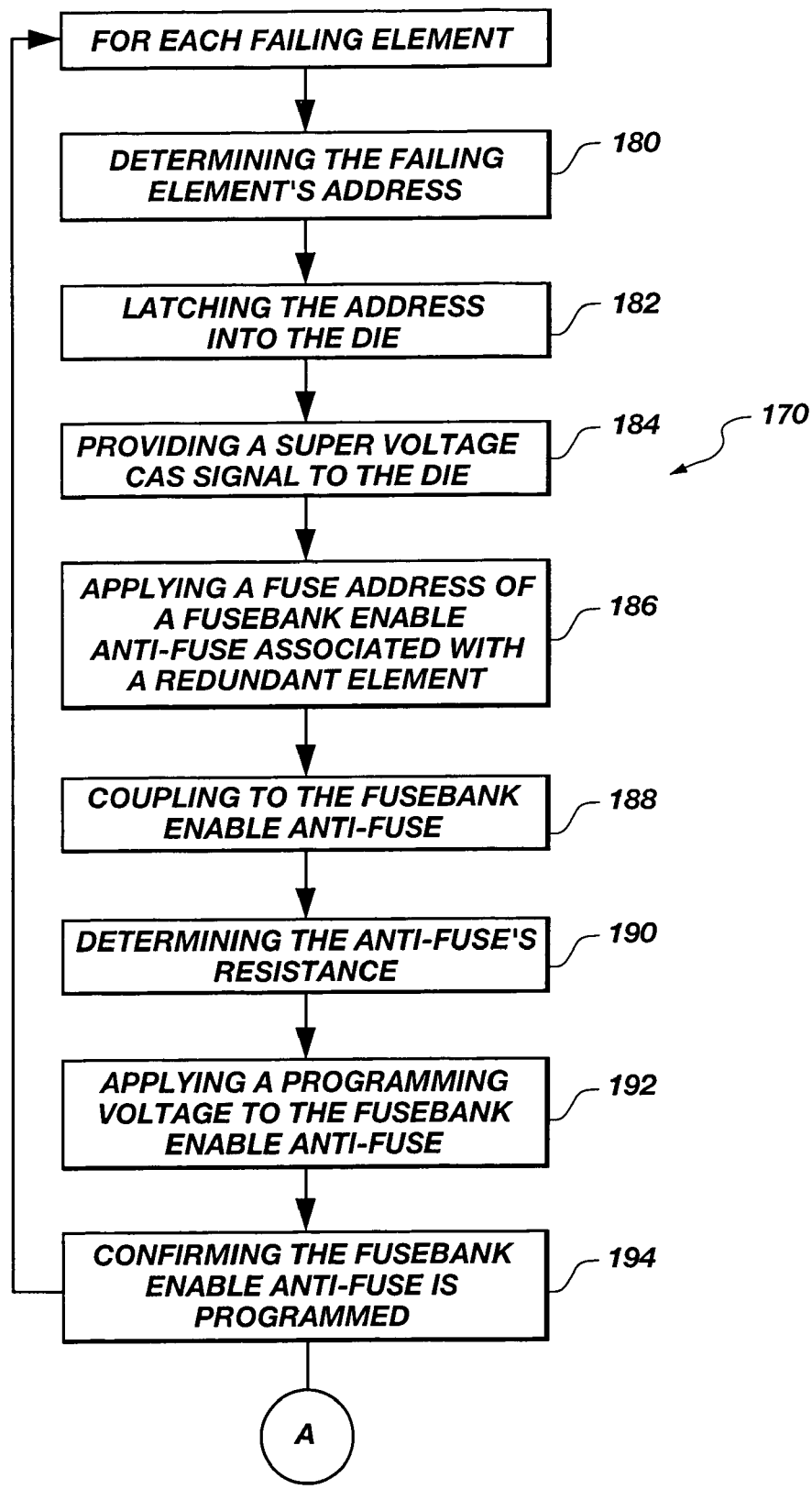
FIGS. 13A and 13B are flow diagrams showing the method of FIGS. 12A and 12B in more detail.
Figure 13B:
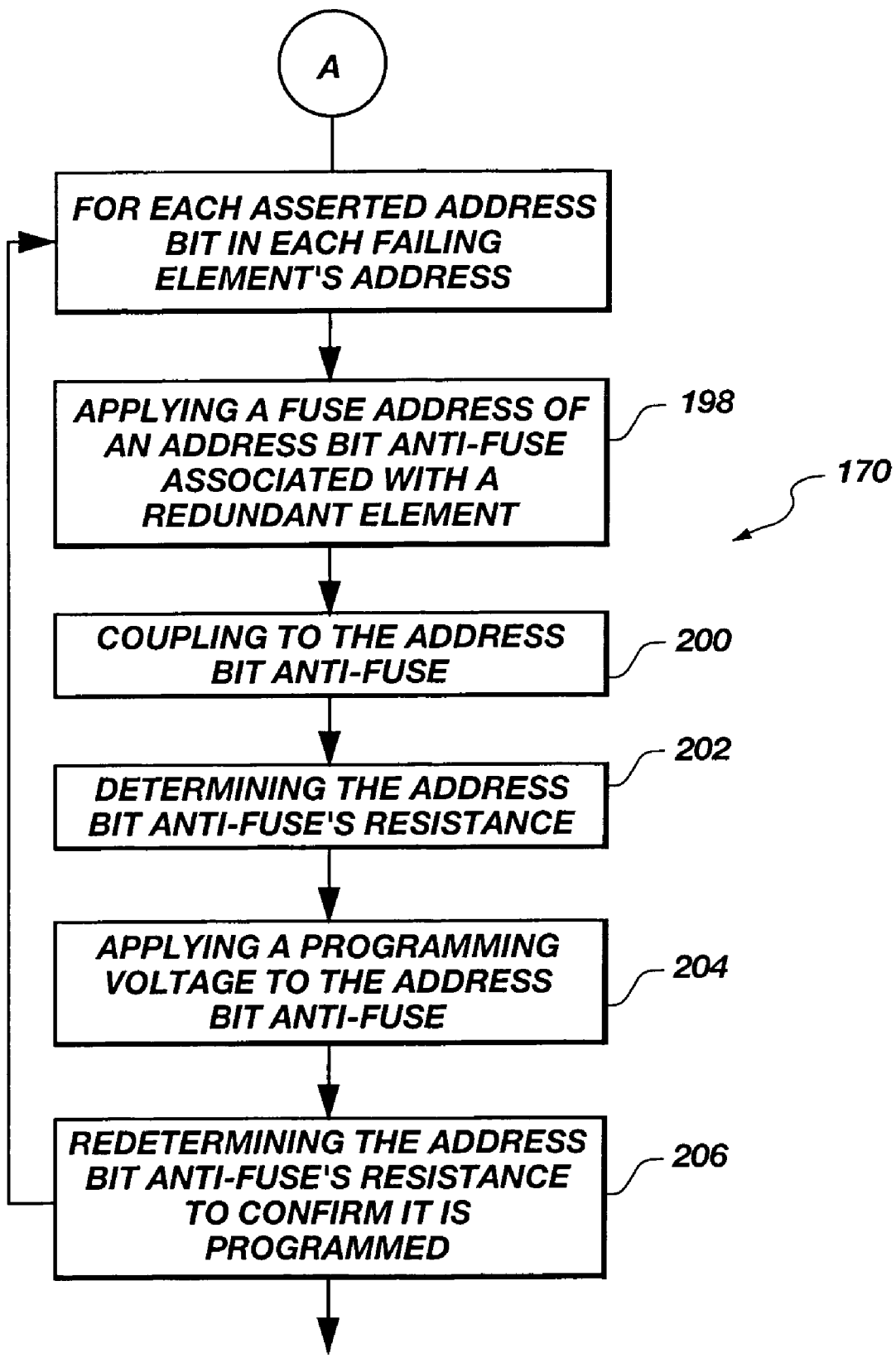

As shown in FIGS. 13A and 13B, the step 170 from FIGS. 12A and 12B of providing repair control signals to a redundant circuit in each die includes, for each identified failing element, the steps of: 180 determining an address associated with the failing element; 182 latching the failing element's address into the dice; 184 providing a programming mode enable signal, such as a super voltage Column Address Strobe (CAS) signal, to the dice to enable a programming mode therein; 186 applying a fuse address of a fusebank enable anti-fuse associated with a redundant element selected to replace the failing element to the IC module's terminals to identify the location of the anti-fuse; 188 coupling to the anti-fuse; 190 determining the anti-fuse's resistance; 192 applying a programming voltage, such as a voltage between 8 and 10 Volts, to the anti-fuse to blow the anti-fuse; 194 redetermining the anti-fuse's resistance to confirm it is blown; and, for each asserted address bit in each failing element's address: 198 applying a fuse address of an address bit anti-fuse associated with the redundant element selected to replace the failing element to the IC module's terminals to identify the location of the anti-fuse; 200 coupling to the anti-fuse; 202 determining the address bit anti-fuse's resistance; 204 applying a programming voltage, such as a voltage between 8 and 10 Volts, to the anti-fuse to blow the anti-fuse; and 206 redetermining the address bit anti-fuse's resistance to confirm it is programmed. As used herein, each "asserted" address bit in a failing element's address may be each "1" bit in the address or each "0" bit in the address.

It will be understood that any or all of the steps 160-206 in the embodiment of FIGS. 12A, 12B, 13A, and 13B, or any portion thereof, may be implemented in hardware, software, or both, using a wide variety of well-known architectures, including, for example, a state machine and the embodiment of FIGS. 10 and 11. It will also be understood that, although the embodiment of FIGS. 12A, 12B, 13A, and 13B has been described with respect to anti-fuses, any programmable circuit or element will work for purposes of this invention. Also, it will be understood that the step 186 in FIG. 13A may include automatic selection of the location and type of redundant element (e.g., redundant row or column) to be used to replace the failing element. Finally, it will be understood that the steps 180 to 206 of FIGS. 13A and 13B may be automated by computer or performed manually.

This invention thus advantageously provides a device and method for testing and repairing IC dice already packaged in IC modules.

Although this invention has been described with reference to particular embodiments, the invention is not limited to these described embodiments. Rather, the invention is limited only by the appended claims, which include within their scope all equivalent devices and methods that operate according to the principles of the invention as described.

What is claimed is:

1. A combination of a plurality of switching circuits for switching first and second voltages to a function circuit in an integrated circuit die having an external communication terminal, the integrated circuit die being provided in a module having a module terminal for receiving the first voltage from circuitry external to the module, the plurality of switching circuits comprising:

a first switching circuit connected to the external communication terminal between the module terminal and the function circuit for selectively isolating the function circuit from the module terminal and for conducting the first voltage to the function circuit, the switching circuit comprising a programmable circuit for isolating the function circuit, the programmable circuit including a programmable element, the switching circuit including a switchable transistor; and an impedance circuit for conducting the second voltage to the function circuit upon isolation of the function circuit from the module terminal and for supporting a voltage differential between the first voltage at the function circuit and the second voltage.

2. The combination of claim 1, wherein the programmable circuit includes a programmable element selected from a group consisting of a metal fuse, a polysilicon fuse, and a flash memory cell.

3. The combination of claim 2, wherein the programmable element is interposed between one of the function circuit, the module terminal, and the external communication terminal.

4. The combination of claim 1, wherein the switching circuit comprises a switchable element selected from a group consisting of an NMOS transistor and a PMOS transistor.

5. The combination of claim 1, wherein the integrated circuit die includes the switching circuit connected between the external communication terminal and the function circuit.

6. The combination of claim 1, wherein the module includes a substrate having the integrated circuit die attached, the substrate including the switching circuit connected between the module terminal and the external communication terminal.

7. A semiconductor die comprising:

a die connection terminal for receiving a first mode initiating signal external to the semiconductor die;

a function circuit responsive to the first mode initiating signal by entering a first mode and responsive to a second mode initiating signal by entering a second mode;

a switching circuit connected between the die connection terminal and the function circuit for selectively isolating the function circuit from the die connection terminal and for conducting the first mode initiating signal to the function circuit, the switching circuit comprising a programmable circuit including at least one switching circuit selected from one of a fuse, a switchable transistor, and a flash memory cell; and an impedance circuit connected to the function circuit for conducting the second mode initiating signal to the function circuit upon the function circuit being isolated from the die connection terminal and for supporting a voltage differential between the first mode initiating signal at the function circuit and the second mode initiating signal.

8. An assembly comprising:

a first terminal and a second terminal for receiving a first voltage and a second voltage respectively from external circuitry;

a plurality of integrated circuit dice, each integrated circuit die including:

an external communication terminal;

a function circuit coupled to the external communication terminal responsive to the first voltage by entering a first mode and responsive to the second voltage by entering a second mode, the second mode being different than the first mode; and a switching apparatus connected between the first terminal and the external communication terminal of each integrated circuit die of the plurality of integrated circuit dice to selectively isolate the function circuit from the first terminal and to conduct the first voltage to the function circuit, the switching apparatus comprising a programmable circuit including a programmable element consisting of a fuse, a switchable transistor, and a flash memory cell; and an impedance apparatus connected between the second terminal and the external communication terminal of each integrated circuit die of the plurality of integrated circuit dice to conduct the second voltage to the function circuit upon isolating the function circuit from the first terminal and to support a voltage differential between the first voltage at the function circuit and the second voltage at the second terminal.

9. A testing method for a semiconductor die in a module by initiating a first mode and a second mode in a function circuit in each integrated circuit die of one or more integrated circuit dice in an integrated circuit module having a module terminal, the function circuit being of a type to enter at least the first mode and at least the second mode in response to receiving respectively a first mode initiate signal and a second mode initiate signal, each integrated circuit die including one or more bond pads connected to circuits for receiving a test mode initiate signal at the module terminal, the method comprising:

conducting the first mode initiate signal to external communication terminals for receiving the first mode initiate signal and from the external communication terminals to the function circuit for initiating the at least the first mode, conducting the first mode initiate signal at least including connecting the module terminal to the function circuit through one of the external communication terminals for receiving the first mode initiate signal;

discontinuing conducting the first mode initiate signal to the function circuit using an element; and conducting the second mode initiate signal to the function circuit when testing a semiconductor die in a module.

10. The method of claim 9, wherein conducting the first mode initiate signal comprises:

connecting and disconnecting the module terminal to and from the function circuit through one of the external communication terminals for receiving the first mode initiate signal; and supporting a difference in voltages between the first mode initiate signal at the function circuit and the second mode initiate signal.

11. The method of claim 10, wherein disconnecting conducting of the first mode initiate signal to the function circuit comprises disconnecting the function circuit from the module terminal.

12. The method of claim 11, wherein disconnecting the function circuit from the module terminal comprises programming a programmable element selected from a group consisting of a fuse, an anti-fuse, and a flash memory cell.

13. An operation verification method for a semiconductor die in a module by initiating a first mode and a second mode in a function circuit in each integrated circuit die of one or more integrated circuit dice in an integrated circuit module having a module terminal, the function circuit being of a type to enter a first mode and a second mode in response to receiving respectively a first mode initiate signal and a second mode initiate signal, each integrated circuit die including one or more bond pads connected to circuits for receiving a test mode initiate signal at the module terminal, the method comprising:

conducting the first mode initiate signal to external communication terminals for receiving the first mode initiate signal and from the external communication terminals to the function circuit for initiating the first mode, conducting the first mode initiate signal at least including connecting the module terminal to the function circuit through one of the external communication terminals for receiving the first mode initiate signal;

discontinuing conducting the first mode initiate signal to the function circuit using an element; and conducting the second mode initiate signal to the function circuit for testing a semiconductor die in a module.

14. The method of claim 13 wherein conducting the first mode initiate signal comprises:

connecting and disconnecting the module terminal to and from the function circuit through one of the external communication terminals for receiving the first mode initiate signal; and supporting a difference in voltages between the first mode initiate signal at the function circuit and the second mode initiate signal.

15. The method of claim 14, wherein disconnecting conducting of the first mode initiate signal to the function circuit comprises disconnecting the function circuit from the module terminal.

16. The method of claim 13, wherein disconnecting the function circuit from the module terminal comprises programming a programmable element selected from a group consisting of a fuse, an anti-fuse, and a flash memory cell.

17. A function verification method for a semiconductor die in a module by initiating a first mode and a second mode in a function circuit in each integrated circuit die of one or more integrated circuit dice in an integrated circuit module having a module terminal, the function circuit being of a type to enter a first mode and a second mode in response to receiving respectively a first mode initiate signal and a second mode initiate signal, each integrated circuit die including one or more bond pads connected to circuits for receiving a test mode initiate signal at the module terminal, the method comprising:

conducting the first mode initiate signal to external communication terminals for receiving the first mode initiate signal and from the external communication terminals to the function circuit for initiating the first mode therein, conducting the first mode initiate signal at least including connecting the module terminal to the function circuit through one of the external communication terminals for receiving the first mode initiate signal;

discontinuing conducting the first mode initiate signal to the function circuit using an element; and conducting the second mode initiate signal to the function circuit for a semiconductor die in a module.

18. The method of claim 17 wherein conducting the first mode initiate signal comprises:

connecting and disconnecting the module terminal to and from the function circuit through one of the external communication terminals for receiving the first mode initiate signal; and supporting a difference in voltages between the first mode initiate signal at the function circuit and the second mode initiate signal.

19. The method of claim 18, wherein disconnecting conducting of the first mode initiate signal to the function circuit comprises disconnecting the function circuit from the module terminal.

20. The method of claim 17, wherein disconnecting the function circuit from the module terminal comprises programming a programmable element selected from a group consisting of a fuse, an anti-fuse, and a flash memory cell.

* * * * *